United States Patent
Rajan (10) Patent No.: US 7,283,945 B2
(45) Date of Patent: Oct. 16, 2007

(54) HIGH LEVEL VERIFICATION OF SOFTWARE AND HARDWARE DESCRIPTIONS BY SYMBOLIC SIMULATION USING ASSUME-GUARANTEE RELATIONSHIPS WITH LINEAR ARITHMETIC ASSUMPTIONS

(75) Inventor: Sreeranga P. Rajan, Sunnyvale, CA (US)

(73) Assignee: Fujitsu Limited, Kawasaki (JP)

( * ) Notice: Subject to any disclaimer, the term of this patent is extended or adjusted under 35 U.S.C. 154(b) by 665 days.

(21) Appl. No.: 09/956,571

(22) Filed: Sep. 18, 2001

(65) Prior Publication Data

US 2002/0055829 A1    May 9, 2002

Related U.S. Application Data

(60) Provisional application No. 60/245,802, filed on Nov. 3, 2000.

(51) Int. Cl.
*G06F 17/50*    (2006.01)
*G06F 9/45*    (2006.01)

(52) U.S. Cl. ............................. 703/17; 703/14; 703/22

(58) Field of Classification Search ................ 703/17, 703/14, 22
See application file for complete search history.

(56) References Cited

U.S. PATENT DOCUMENTS

| | | | |
|---|---|---|---|
| 5,163,016 A * | 11/1992 | Har'El et al. .................. 716/5 |
| 5,502,661 A * | 3/1996 | Glunz .......................... 703/14 |
| 5,537,580 A * | 7/1996 | Giomi et al. .................. 716/19 |
| 5,555,201 A | 9/1996 | Dangelo et al. |
| 5,680,332 A * | 10/1997 | Raimi et al. .................. 703/13 |
| 5,774,370 A * | 6/1998 | Giomi ........................... 716/4 |
| 5,841,663 A | 11/1998 | Sharma et al. |
| 5,999,717 A * | 12/1999 | Kaufmann et al. ............. 703/2 |
| 6,044,211 A | 3/2000 | Jain |
| 6,064,819 A | 5/2000 | Franssen et al. |
| 6,141,790 A * | 10/2000 | Beausang et al. ............... 716/5 |
| 6,157,901 A * | 12/2000 | Howe ............................ 703/2 |
| 6,175,946 B1 * | 1/2001 | Ly et al. ........................ 716/4 |
| 6,378,112 B1 * | 4/2002 | Martin et al. .................. 716/5 |
| 6,484,134 B1 * | 11/2002 | Hoskote ....................... 703/14 |
| 6,539,345 B1 * | 3/2003 | Jones et al. .................... 703/15 |
| 6,591,400 B1 * | 7/2003 | Yang ............................ 716/4 |

(Continued)

OTHER PUBLICATIONS

Extraction of finite state machines from transistor netlists by symbolic simulation Pandey, M.; Jain, A.; Bryant R.E.; Beatty, D.; York, G.; Jain, S.; Computer Design: VLSI in Computers and Processors, Oct. 2-4 1995. ICCD '95. Proceedings.pp. 596-601.*

(Continued)

*Primary Examiner*—Fred Ferris
*Assistant Examiner*—Akash Saxena
(74) *Attorney, Agent, or Firm*—Christie, Parker & Hale, LLP (57) ABSTRACT

A state-transition system is extracted from a high-level description of a design. Assumptions regarding states of the design are determined for an initial clock cycle. Linear arithmetic relations are introduced to these assumptions. Guarantees are determine that provide properties of the design that hold after a fixed number of clock cycles. Symbolic simulation is performed for a limited number of clock cycles on the state transition system of the design. If the guarantees hold once simulation is performed, the design is verified. Otherwise, counter-examples are generated.

7 Claims, 7 Drawing Sheets

U.S. PATENT DOCUMENTS

| | | | |
|---|---|---|---|
| 6,654,715 B1* | 11/2003 | Iwashita | 703/22 |
| 6,728,665 B1* | 4/2004 | Gupta et al. | 703/2 |
| 6,848,088 B1* | 1/2005 | Levitt et al. | 703/2 |
| 6,944,838 B2* | 9/2005 | McMillan | 703/2 |
| 6,975,976 B1* | 12/2005 | Casavant et al. | 703/14 |
| 2002/0046393 A1* | 4/2002 | Leino et al. | 717/7 |
| 2002/0099982 A1* | 7/2002 | Andersen et al. | 714/47 |
| 2003/0066039 A1* | 4/2003 | Zhong et al. | 716/5 |
| 2003/0225552 A1* | 12/2003 | Ganai et al. | 703/2 |
| 2004/0006451 A1* | 1/2004 | Bharadwaj et al. | 703/2 |
| 2004/0107174 A1* | 6/2004 | Jones et al. | 707/1 |

OTHER PUBLICATIONS

Formal verification based on assume and guarantee approach: a case study; Roy, S.K.; Iwashita, H.; Nakata, T.; Design Automation Conference, 2000. Proceedings of the ASP-DAC 2000. Asia and South Pacific , Jan. 25-28, 2000; pp. 77-80☐☐.*

Equivalent design representations and transformations for interactive scheduling; Ang, R.P.; Dutt, N.D.; Computer-Aided Deign, 1992. ICCAD-92. Digest of Technical Papers., 1992 IEEE/ACM International Conference on , Nov. 8-12, 1992; pp. 332-335.*

CTL model checking based on forward state traversal; Iwashita, H.; Nakata, T.; Hirose, F.;☐☐Computer-Aided Design, 1996. ICCAD-96. Digest of Technical Papers., 1996 IEEE/ACM International Conference on , Nov. 10-14, 1996; pp. 82-87☐☐.*

A new model for improving symbolic product machine traversal;Cabodi, G.; Camurati, P.; Corno, F.; Gai, S.; Prinetto, P.; Sonza Reorda, M.;Design Automation Conference, 1992. Proceedings., 29th ACM/IEEE , Jun. 8-12, 1992; pp. 614-619.*

On the complexity of modular model checking☐☐Vardi, M.Y.; Logic in Computer Science, 1995. LICS '95. Proceedings., Tenth Annual IEEE Symposium on , Jun. 26-29, 1995 ; pp. 101-111.*

Symbolic simulation-techniques and applications; Bryant, R.E.; Design Automation Conference, 1990. Proceedings. 27th ACM/IEEE , Jun. 24-28, 1990; pp. 517-521.*

Efficient generation of counterexamples and witnesses in symbolic model checking; E. M. Clarke, O. Grumberg, K. L. McMillan, X. Zhao; Jan. 1995 Proceedings of the 32nd ACM/IEEE conference on Design automation; Google & IEEE searches "dual next-state".*

Extraction of finite state machines from transistor netlists by symbolic simulation Pandey, M.; Jain, A.; Bryant, R.E.; Beatty, D.; York, G.; Jain, S.; Computer Design: VLSI in Computers and Processors, Oct. 2-4, 1995. ICCD '95. Proceedings.pp. 596-601.*

On the complexity of modular model checking☐☐Vardi, M.Y.; Logic in Computer Science, 1995. LICS '95. Proceedings., Tenth Annual IEEE Symposium on , Jun. 26-29, 1995 ; pp. 101-111.*

CTL model checking based on forward state traversal; Iwashita, H.; Nakata, T.; Hirose, F.;☐☐Computer-Aided Design, 1996. ICCAD-96. Digest of Technical Papers., 1996 IEEE/ACM International Conference on , Nov. 10-14, 1996; pp. 82-87.*

Efficient generation of counterexamples and witnesses in symbolic model checking; E. M. Clarke, O. Grumberg, K. L. McMillan, X. Zhao; Jan. 1995 Proceedings of the 32nd ACM/IEEE conference on Design automation; Google & IEEE searches "dual next-state".*

Equivalent design representations and transformations for interactive scheduling; Ang, R.P.; Dutt, N.D.; Computer-Aided Design, 1992. ICCAD-92. Digest of Technical Papers., 1992 IEEE/ACM International Conference on , Nov. 8-12, 1992; pp. 332-335.*

An introduction to assertional reasoning for concurrent system;A. Udaya Shankar; ACM Computing Surveys (CSUR);vol. 25 , Issue 3 (Sep. 1993); pp. 225-262 ISSN:0360-0300.*

IEEE 1998 paper "Extending Statecharts with Temporal Logic" by Arcot Sowmya, Member, IEEE, and S. Ramesh.*

Research paper "On the Construction of Automata from Linear Arithmetic Constraints" (2000) by Pierre Wolper, Bernard Boigelot.*

M. Abadi and L. Lamport, *Conjoining Specifications*, ACM Trans. Prog. Lang. Syst., 17(3):507-533, May 1995.

R. Alur et al., *Automatic Symbolic Verification of Embedded Systems*, Proc. of Real Time Systems Symposium, (37 pgs) 1993.

R. Alur et al., *Modularity for Timed and Hybrid Systems*, Proceedings of the 8th International Conference on Concurrency Theory, (15 pgs) 1997.

R. Alur et al., *Partial-Order Reduction in Symbolic State Space Exploration*, Proceedings of the 9th International Conference on Computer-aided Verification, (12 pgs) 1997.

R. Alur et al., *Reactive Modules*, Proceedings of the 11th Annual Symposium on Logic in Computer Science, (39 pgs) 1996.

R. Beckmann et al., *Application of Constraint Logic Programming for VLSI CAD Tools*, Proc. 1st Int. Conf. Constraints in Computer Logic, (18 pgs) Sep. 1994.

S. Bensalem et al., *Powerful Techniques for the Automatic Generation of Invariants*, Conference on Computer Aided Verification, (13 pgs) Jul. 1996.

A. Browne et al., *An Improved Algorithm for the Evaluation of Fixpoint Expressions*, Sixth Conference on Computer Aided Verification, (27 pgs) 1994.

J.R. Burch,, et al., *Symbolic Model Checking: $10^{20}$ States and Beyond*, In Proc. of the 5th Annual IEEE Symposium on Logic in Computer Science, pp. 428-439, (33 pages) 1990.

D. Currie et al., *Automatic Formal Verification of DSP Software*, 37th Design Automation Conference, (6 pgs) Jun. 2000.

D. Cyrluk, et al., *Effective Theorem Proving for Hardware Verification*, Proceedings of the 2nd International Conference on Theorem Provers in Circuit Design, Theory, Practice, and Experience, vol. 901, pp. 203-222, 1994.

S. Das et al., *Experience With Predicate Abstraction*, 11th International Conference on Computer-Aided Verification, (12 pgs) Jul. 1999.

M. Dwyer et al., *Filter-Based Model Checking of Partial Systems*, Proceedings of the Sixth ACM SIGSOFT Symposium on Foundations of Software Engineering, (14 pgs) Nov. 1998.

S. Graf, et al., *Verifying Invariants Using Theorem Proving*, Proceedings of the Eighth International Conference on Computer Aided Verification, vol. 1102, pp. 196-207, 1996.

E. P. Gribomont et al., *Simplification of Boolean Verification Conditions*, Theoretical Computer Science, (25 pgs) 1999.

K. Havelund et al., *Experiments in Theorem Proving and Model Checking for Protocol Verification*, Third International Symposium of Formal Methods Europe, (20 pgs) 1996.

T. A. Henzinger, et al., *You Assume, We Guarantee: Methodology and Case Studies*, in Proc. of the 10th Intl. Conf. on Computer-Aided Verification, Vancouver, Canada (17 pgs) Jul. 1998.

W. Hunt et al., *The Verification of a Bit-slice ALU*, Workshop on Hardware Specification, Verification and Synthesis: Mathematical Aspects, (28 pgs) 1989.

R. B. Jones, et al., *Efficient Validity Checking for Processor Verification*, In Proc. IEEE Int. Conf. on Comput.-Aided Design, pp. 2-6, Nov. 1995.

L. Lamport, *TLA in Pictures*, IEEE Trans. on SE, 16(3):872-923, May 1995.

S. Rajan, et al., *An Integration of Model Checking with Automated Proof Checking*, Proceedings of the 7th International Conference On Computer Aided Verification, vol. 939, pp. 84-97, 1995.

J. Rushby, *Verification Diagrams Revisited: Disjunctive Invariants for Easy Verification*, Computer Aided Verification, (13 pgs) Jul. 2000.

B. Steffen et al., *The Fixpoint-Analysis Machine*, Proceedings of the 6th Int. Conference on Concurrency Theory (CONCUR'95), (16 pgs) Aug. 1995.

J. Su et al., *Formally Verifying Data and Control With Weak Reachability Invariants*, Formal Method In Computer-Aided Design, (17 pgs) 1998.

J. Andersen, et al., *Composition Safety Logics*, BRICS RS-97-13. (19 pgs) Jun. 1997.

C. Barrett, et al., *Validity Checking for Combinations of Theories with Equality*, Formal Methods In Computer-Aided Design (FMCAD'96), Lecture Notes in Computer Science 1166, Springer-Verlag, pp. 187-201, 1996.

T. Bultan, et al., *Model Checking Concurrent Systems with Unbounded Integer Variables: Symbolic Representations, Approximations and Experimental Results*, ACM Transactions on Programming Languages and Systems, 21(4):747-789, Jul. 1999.

R. Bryant, *A Methodology for Hardware Verification Based on Logic Simulation*, Journal of the ACM, 38(2) 295-328, Apr. 1991.

E. Clarke, et al., *Verification Tools for Finite-State Concurrent Systems*, A Decade of Concurrency-Reflections and Perspectives, Springer-Verlag, vol. 803, pp. 124-175, 1993.

P. Cousot, et al., *Systematic Design of Program Analysis Frameworks*, Laboratorie d'Informatique, U.S.M.G., BP.53X, France, Conference Record of the Sixth Annual ACM Symposium on Principles of Programming Languages, (pp. 269-282), Jan. 1979.

G. Graw, et al., *Composing Object-Oriented Specifications and Verifications with cTLA*, in Workshop on Semantics, Dept. of Computer Science, Dortmund University, Dortmund, Germany (14 pgs) 1999 ACM ISBN 354066954X.

A. Gupta, et al., *Toward Formalizing a Validation Methodology Using Simulation Coverage*, Princeton, NJ, Design Automation Conference, (6 pgs) 1997.

A. Hu, et al., *Efficient Verification with BDDs Using Implicitly Conjoined Invariants*, Computer Aided Verification, (pp. 3-14), 1993.

J. Joyce, et al., *Linking BDD-Based Symbolic Evaluation to Interactive Theorem-Proving*, In the 30$^{th}$ Design Automation Conference, (6 pgs) 1993.

L. Lamport, *Introduction to TLA*, SRC Technical Note, 1991-001, Digital Systems Research Center, Palo Alto, California (8 pgs) 1994.

C. Fasareanu, et al., *Assume-Guarantee Model Checking of Software: A Comparative Case Study*, Department of Computing and Information Sciences, Kansas State University, Manhattan, KS (20 pgs) PubIn:Theoritical & Applied Aspects of SPIN Model Checking (LNCS 1680) Sep. 1999.

S. Rajan; *Correctness of Transformations in High Level Synthesis: Formal Verification*, In Proc. CHDL'95, North-Holland, (18 pgs) 1995.

\* cited by examiner

```
entity gcd is
   port (clock : in bit;
      reset : in bit;
      xi, yi : in integer;
      ready : in bit;
      done : out bit := '0' ;
      out1 : out integer);
end gcd;

architecture gcd of gcd is
begin
      process
            variable x, y : integrer;
      begin
            wait until (clock'event and clock = '1' and ready = '0');
            done <= '0';
            x := xi;
            y := yi;
            wait until (clock'event and clock = '1' and ready = '0');
            while (x /= y) loop
                  wait until (clock'event and clock = '1');
                  if (x < y) then
                        y := y - x;
                  else
                        x := x-y;
                  end if;
            end loop;
            wait until (clock'event and clock = '1');
            done <= '1';
            out1 <= x;
      end process;
end gcd;
```

FIG. 5

AF "equal":
  (x = 2 * y) leads to
  done
  and
  (x = y);
} — 61

Bounded AF "equal":
  ASSUME
  (x = 2 * y)
  GUARANTEE
  within [4 Clock Cycles]
  done and (x = y);
} — 63

Bounded AF "Should Not Prove":
  non_deterministic_inputs (ready (AT 0:TRUE, AT 1:FALSE))
  ASSUME
  (ready := TRUE)
  and
  (clock,
    clock_event,
    not reset,
    not done)
  GUARANTEE
  within [4 Clock Cycles]
  done;
} — 65

HIGH LEVEL VERIFICATION OF SOFTWARE AND HARDWARE DESCRIPTIONS BY SYMBOLIC SIMULATION USING ASSUME-GUARANTEE RELATIONSHIPS WITH LINEAR ARITHMETIC ASSUMPTIONS

CROSS-REFERENCE TO RELATED APPLICATIONS

This application claims the benefit of U.S. Provisional Application No. 60/245,802 filed Nov. 3, 2000, which is hereby incorporated by reference as if set forth in full herein.

BACKGROUND

The present invention generally relates to hardware and software formal verification systems and methods, and more specifically, to providing model checking and symbolic simulation using a hardware description language.

Formal verification is widely used to verify or identify correctness of a software or hardware design. Correctness, in general, is a determination that the design is equivalent to a specification. The specification commonly represents expected responses of the design exposed to predetermined stimuli, e.g., test vector sequences. The design and specification can be represented in multiple forms of abstractions.

However, it is often difficult to construct an abstract behavior to a given specification without an exhaustive construction of the design's state space. Furthermore, verification of the design often requires that a large part of the state space of the design be generated, as the design is exhaustively checked for all possible computation scenarios. Since, the number of states may grow exponentially relative to the number of components in the design, verifying the design often becomes a resource-consuming operation, both in terms of memory and processor utilization and time. Thus, there are often a limit to the size of the design that may be verified.

Furthermore, at times, verification of designs requires multiple iterative and interactive input from a designer making the process more arduous and time consuming. Also, integration of the verification within the design process becomes difficult and less "automatic". Moreover, if the verification of the design result in the design not being verified, then providing a "debug" trace to enable a designer to locate the error would be helpful. Also, providing this "debug" information early in the design cycle allows the correction of these errors to be less expensive in terms of time and money.

SUMMARY OF THE INVENTION

A state-transition system is extracted from a high-level description. Assumptions for the initial clock cycles are established in which linear arithmetic relations are introduced. Guarantees are also established that hold after a fixed number of clock cycles. Symbolic simulation is performed for a limited number of clock cycles on the transition system. The symbolic simulation is either back-image computation by backward traversal or dual next-state computation by forward traversal of the state-transition system. In either case, symbolic simulation is integrated with the high-level decision procedure. As such, substitution for the computation of the weakest precondition directly on the internal data structures of the decision procedure and generation of explicit counter-example traces are achieved.

Many of the attendant features of this invention will be more readily appreciated as the same becomes better understood by reference to the following detailed description considered in connection with the accompanying drawings.

DETAILED DESCRIPTION

Generally, the present invention provides verification systems and methods for a hardware or software design. As such, the verification systems and methods of the present invention verify a representation of the hardware or software design that satisfies a design specification. The design specification includes expected responses for a given stimulus or stimuli provided to the design. The hardware or software design are described or represented by a high level representation. In one embodiment, the high level representation is a register transfer level circuit represented by a hardware description language, such as VHDL. In another embodiment, the high level representation is a software program represented by a high-level software language, such as Pascal or C++.

Figure 1:
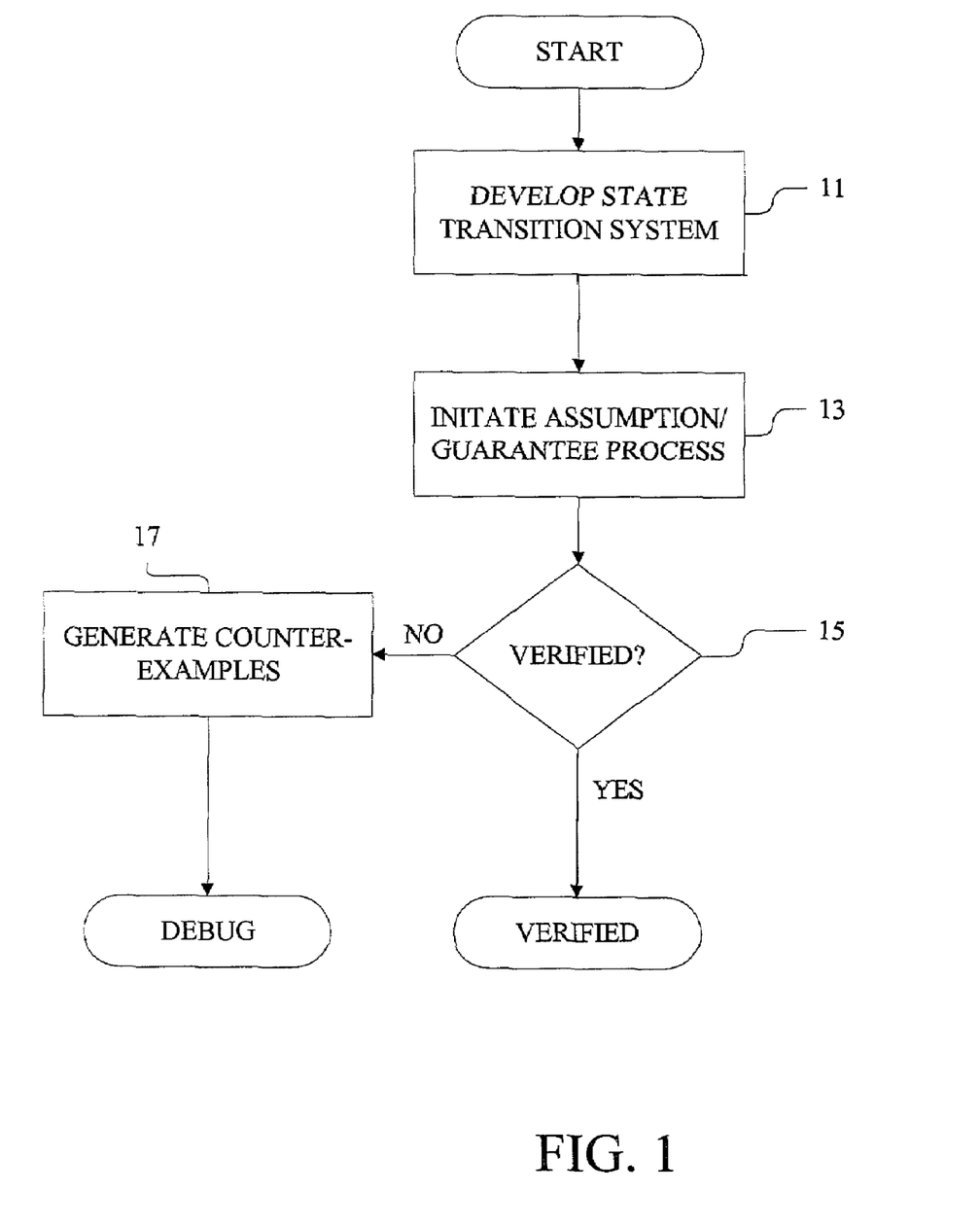
FIG. 1 illustrates a flow diagram of one embodiment of the process of verifying a design for the present invention.

Referring now to FIG. 1, the process receives a high level representation of a design/system to be verified. In block 11, the process extracts a state transition system from the high-level description. The state transition system extracted from the high-level design representation is a description of a number of states and the relationship between states, i.e., transitions from one state to another state. In one embodiment, the state transition system is a directed acyclic graph such as a binary decision diagram in which each state is encoded as a boolean value or representation. In one embodiment, the state transition system is specified as an asynchronous composition of transitions written as guarded multi-assignments.

In one embodiment, a high-level specification is provided to a synthesis tool that generates a control-data-flow graph. The control-data-flow graph represents the control operations and data operations of the design and the interactions between the control and data operations. Using the control-data-flow graph, a state transition system is extracted. The state transition system is then translated to a specification language that defines/represents particular properties regarding the design, which will be discussed in more detail later.

Referring back to FIG. 1, the process, in block 13, initiates the assume/guarantee sub-process. After the assume/guarantee sub-process ends, the process in block 15 determines if the system is verified. If, in block 15, the process determines that the system has been verified, the process ends.

Otherwise, if, in block 15, the process determines that the system is not verified, then the process generates counter-examples, in block 17, and the process ends. In one embodiment, the counter-examples generated are used to debug, i.e., identify the errors, in the high level representation recieved by the process.

Figure 2:
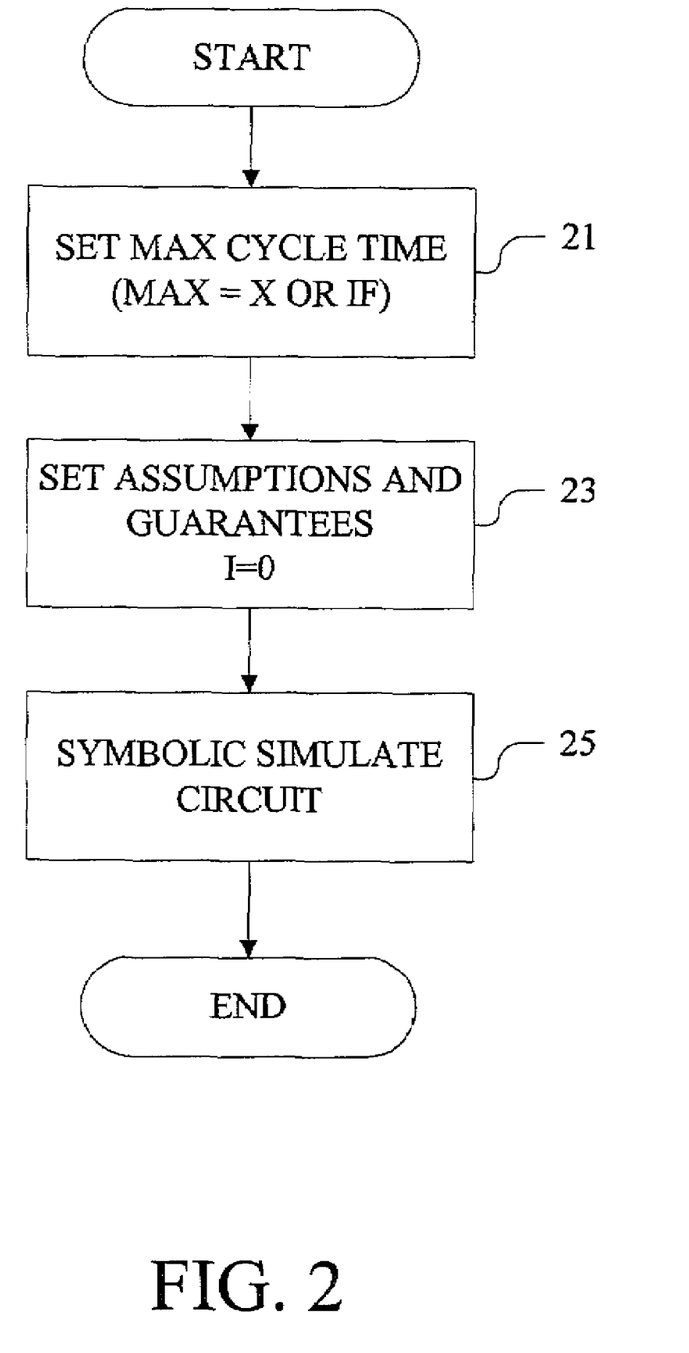
FIG. 2 illustrates a flow diagram of one embodiment of the sub-process of establishing assumptions and guarantees and initiating simulation of the design.

In FIG. 2, the sub-process sets a maximum cycle time, in block 21. The maximum cycle time represents the number of cycles the state transition system is to be simulated. In one embodiment, the maximum cycle time is infinite or undefined. As such, simulation of the state transition system is performed until a fixpoint is reached. In block 23, the sub-process generates the assumptions and guarantees for the state transition system. Assumptions are properties assumed of data. In other words, assumptions are conditions or values assigned to states or variables that are considered to be true or valid at an initial clock cycle. An example of an assumption is $x \leq 0$ and $y \leq 0$ for computing of a greatest common divisor for two arbitrary integers x and y. Hence, initial values for variables and functions are established. A guarantee is a required property of a result. In other words, guarantees are conditions or values assigned to states or variables that must be true or valid at the end of a predetermined number of clock cycles. An example of a guarantee is that x equals y for any x and any y in computing of the greatest common divisor for two arbitrary integers x and y at the end of a predetermined number of clock cycles.

In one embodiment, the assumption and guarantees are stated as quantifier-free first order logic formulas potentially having high-level data types such as integers, arrays, and uninterpreted functions and a mixture of concrete and symbolic variables. In a further embodiment, the assumptions/guarantees are provided by an external source, such as from a user or designer. In another embodiment, the assumptions/guarantees are predetermined and stored in memory. As such, in block 23, the sub-process locates and retrieves the stored assumptions/guarantees for the state transition system. Also, in establishing the assumptions in block 23, the sub-process introduces linear arithmetic relations between symbolic variables in the assumptions. For example, extending the previous example of computing a greatest common divisor for two arbitrary integers x and y, a linear relation of $x=4*y$ is introduced. By adding linear relations to the assumptions, simulation of the state transition system converges quicker and thus state space explosion problems are reduced. In block 25, the sub-process symbolically simulates the state transition system and the sub-process ends.

In one embodiment, symbolic simulation of the state transition system involves computation for traversal of the state space of the transition system which terminates the traversal when the computation converges to a fixpoint. In other words, a set of initial states S are determined. From the initial states a computational path along the system is determined to identify a set of reachable states R. These reachable states are compared to a subset of states I that satisfy a property to be verified. In one embodiment, the symbolic simulation is performed by using a back image computation by backward traversal of the state transition system. In another embodiment, the symbolic simulation is performed by using a next-state computation by forward traversal of the state transition system.

In either embodiment, in performing symbolic simulation, a set of states S from the state transition system are determined. A transition relation on S, a transition from one state in S to another state in S, is $R : S \times S \Rightarrow B$, where B denotes a boolean value. A predicate transformer is $wp:(S \times S \Rightarrow B) \Rightarrow ((S \Rightarrow B) \Rightarrow (S \Rightarrow B))$. The predicate transformer maps one predicate to another predicate. A predicate describes properties or relations of states in a certain domain. Application of a predicate to a state of its domain yields exactly one truth value (true or false). In other words, a predicate expresses that a particular implementation fulfills certain requirements. Thus, a set of states defined by the set (wp R Q), where Q is a subset of states of the states S, is the largest set of states, such that a step based on the transition relation R from one of the states from the set (wp R Q) cannot lead to a state outside of Q.

The transition relation R also has the following restricted form, $R(S,S')=\vee g_i(s) \wedge (S'=f_i(s))$, $i=1,\ldots n$, where $g_i:S \Rightarrow B$, $i=1,\ldots,k$ are predicates on states and $f_i:S \Rightarrow S$, $i=1,\ldots,k$ are functions from states to states. Thus, wp evaluates to (wp R Q)=$\lambda S \wedge \neg g_i(s) \wedge Q(f_i(s))$, $i=1,\ldots,n$ which can be represented as guarded multi-assignments (an execution of assignments when specific conditions are true). Thus, states are assignments of values to a set of state variables and the state space is a cross product of the variables' domains $(S=D_1,\ldots,D_k)$.

Functions and predicates on states are represented as symbolic expressions in terms of the state variables. Hence, functions from states to states are expressed as multi-assignments $(f=[V_{q1}:e_{q1};\ldots;V_{qm}:e_{qm}]$, where $e_{qj}:S \Rightarrow D_{qj}$ and $j=1,\ldots,m$ represents the next-state function for the state variable $V_{qj}$. The function composition Q o f is computed by substitution and thus corresponds to $Q[e_{q1}/V_{q1},\ldots,e_{qm}/V_{qm}]$ where $X[e_1/V_1,\ldots,e_k/V_k]$ denotes the formula obtained by simultaneous substitution of $e_i$ for $v_i$ in the formula Q. Thus, a back-image of a predicate can be computed symbolically via substitution.

Figure 3:
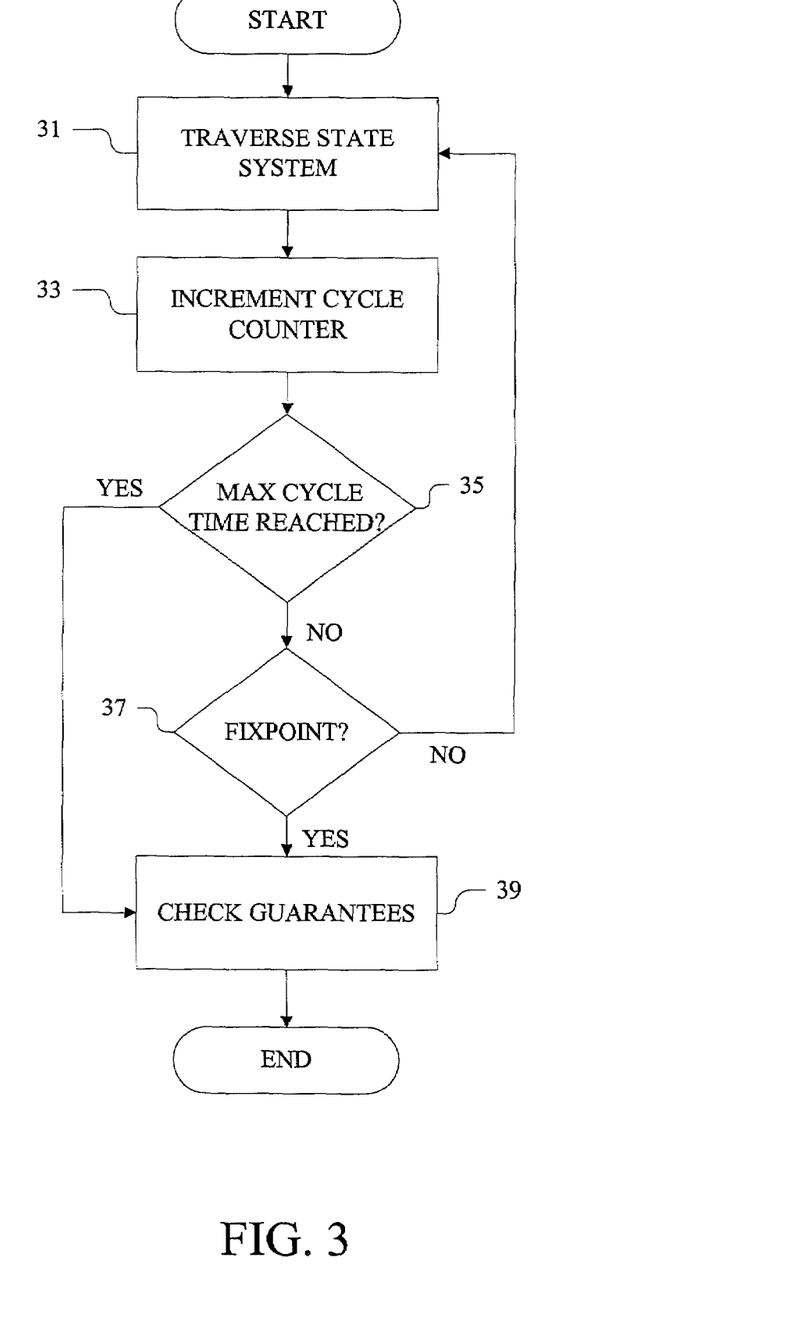
FIG. 3 illustrates a flow diagram of one embodiment of the subproccess of symbolically simulating the design.

Referring now to FIG. 3, one embodiment of a sub-process in which the state transition system is simulated is shown. In block 31, the sub-process traverses the state system. In block 33, the sub-process increments cycle counter. In block 35, the sub-process determines if the cycle counter corresponds to the maximum cycle time. By limiting the simulation to a fixed number of clock cycles or iterations, state space explosion problems are reduced. If the cycle counter corresponds to the maximum cycle time, the sub-process in block 39 compares the guarantees with the simulation results and the sub-process ends. As such, the guarantees are located, retrieved and compared to simulation results. The guarantee is, for example, the predicate Q that represents the property that holds at the end of a fixed number of clock cycles. If the cycle counter does not correspond to the maximum cycle time, the sub-process in block 37 determines if a fixpoint has been reached. For instance, for fixpoint computation, $Z_0=Q$ and $Z_{i+1}=\lambda s.Q(s) \wedge (wp\ R\ Z_i)s$, where i is greater than or equal to zero and corresponds to a single state-transition step. As such, in order to determine if a fixpoint has been reached, the current state $Z_i$ is examined. If the current state corresponds to the previous state $Z_{i-1}$, then the fixpoint has been reached. If the sub-process determines that a fixpoint is reached, the sub-process continues to block 39 to check the guarantees with the simulation results. Otherwise, the sub-process, continues to block 31 and the simulation of the state transition system continues.

Figure 4:
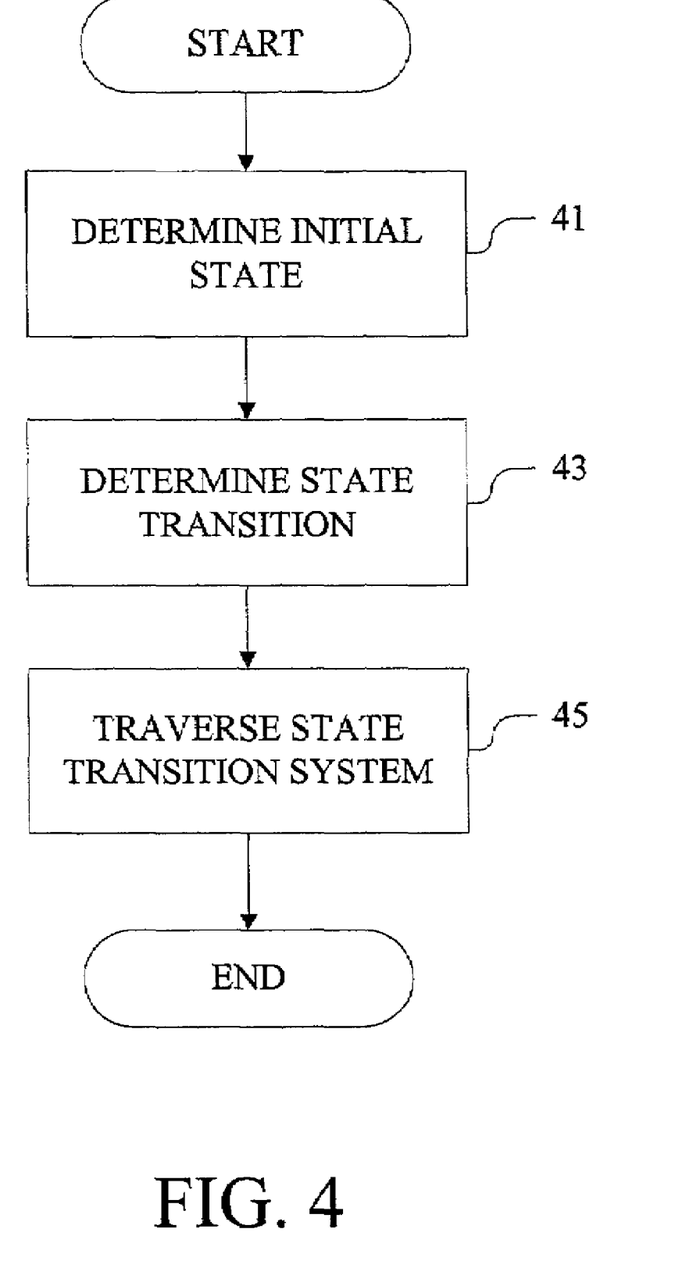
FIG. 4 illustrates a flow diagram of one embodiment of generating counter-examples.

When the design is verified, at the end of the specified fixed number of iterations, the initial state set $Q_o$ corresponds to the established assumptions, the initial state set $Q_o$ is a subset of $Z_i$ and thus $Q_o \Rightarrow Z_i$ is valid. However, upon determining that the design is not verified, i.e., $Q_o \Rightarrow Z_i$ is not valid, a counter-example trace is generated. FIG. 4 illustrates an embodiment of the process of generating a counter-example. In block 41, the sub-process determines an initial state. The initial state $s_i$ is a state that satisfies $Q_o \wedge \neg Z_i$. In block 43, the sub-process determines a state transition. The state transition is a transition from a state $s_j$, where $j=i \ldots 1$, to a state $s_{j-1}$, such that $s_{j-1} \in \neg Z_{j-1}$. In block 43, the sub-process traverses the state transition system from the determined initial states using the defined state transition and the sub-process ends. Thus, since $Z_o = Q$, the sequence of states $(s_i, \ldots, s_o)$ is a counter-example trace from an allowed initial state to a state outside of Q. In one embodiment, the counter-examples are assignments to variables for formulas of the design written in terms of linear equations and boolean connectives.

Figure 5:
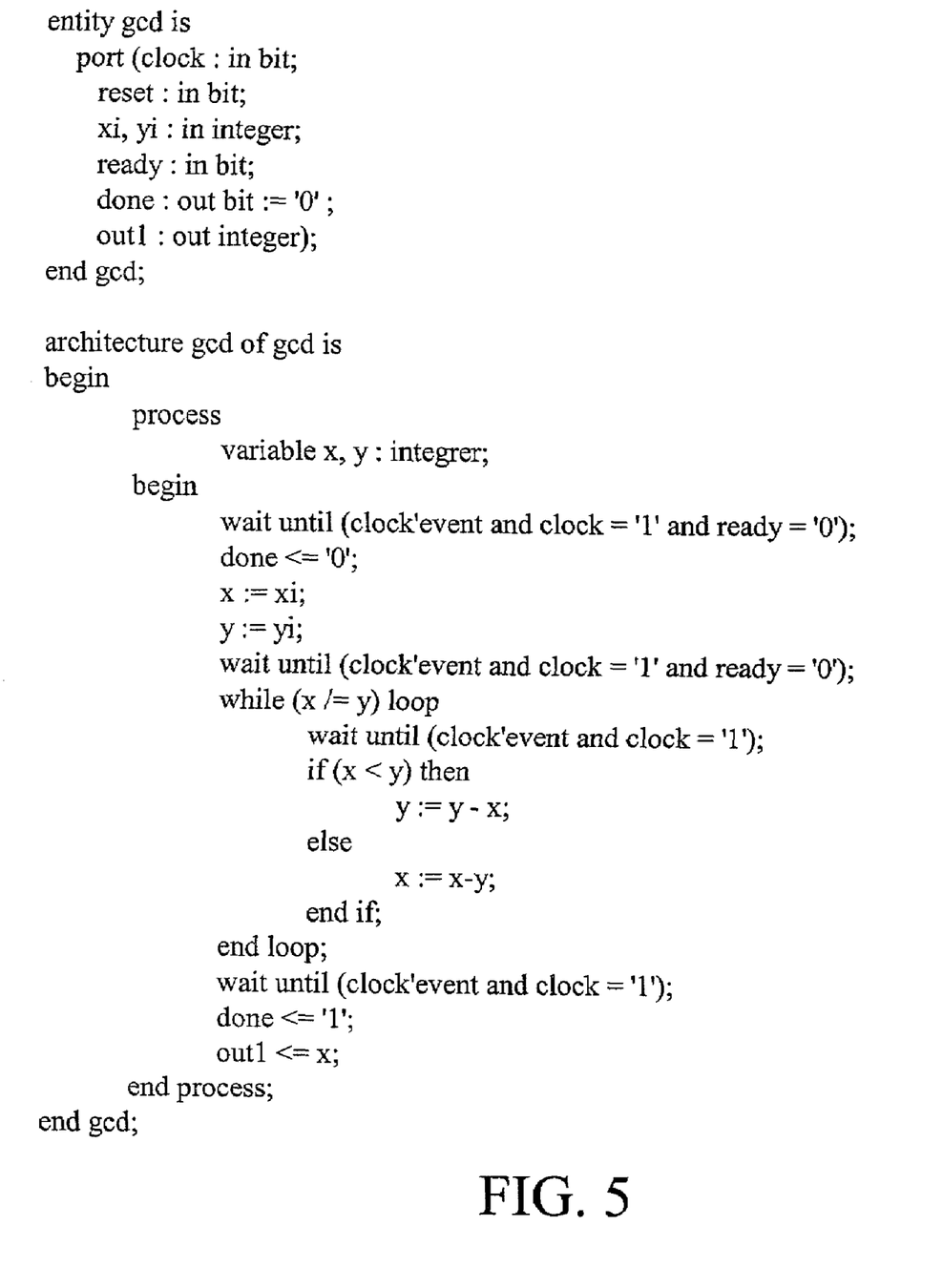
FIG. 5 illustrates an exemplary design represented in VHDL.
Figure 6:
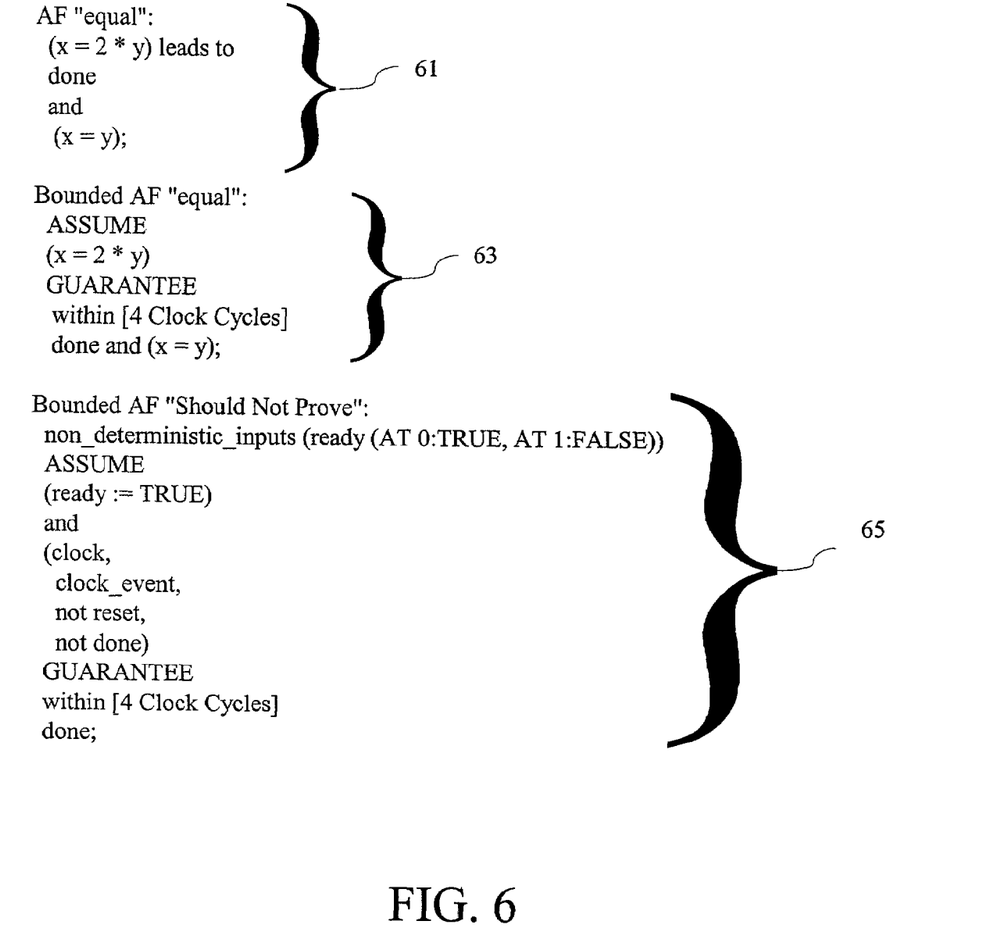
FIG. 6 illustrates an exemplary specification representation establishing assumptions and guarantees by the present invention.

FIG. 5 illustrates an exemplary high-level specification verifiable by the present invention. The high-level specification provides a representation of computing the Greatest Common Divisor (GCD). As such, the specification provides that for any two integer values xi and yi, the process generates a greatest common divisor (out1). FIG. 6 illustrates one embodiment of properties specified and provided by the present invention. Portion 61 defines assumptions for the computing of the GCD. In particular, the assumption includes an arithmetic relation (x=2*y) between the two variables. By providing this assumption, additional invariants, i.e., properties that will remain constant for each successive iteration of the loop for processing the GCD, are not required, in order for the design to be verified. Portions 63 and 65 define the bounding functions providing an upper bound on the number of iterations for the GCD to be determined.

Figure 7:
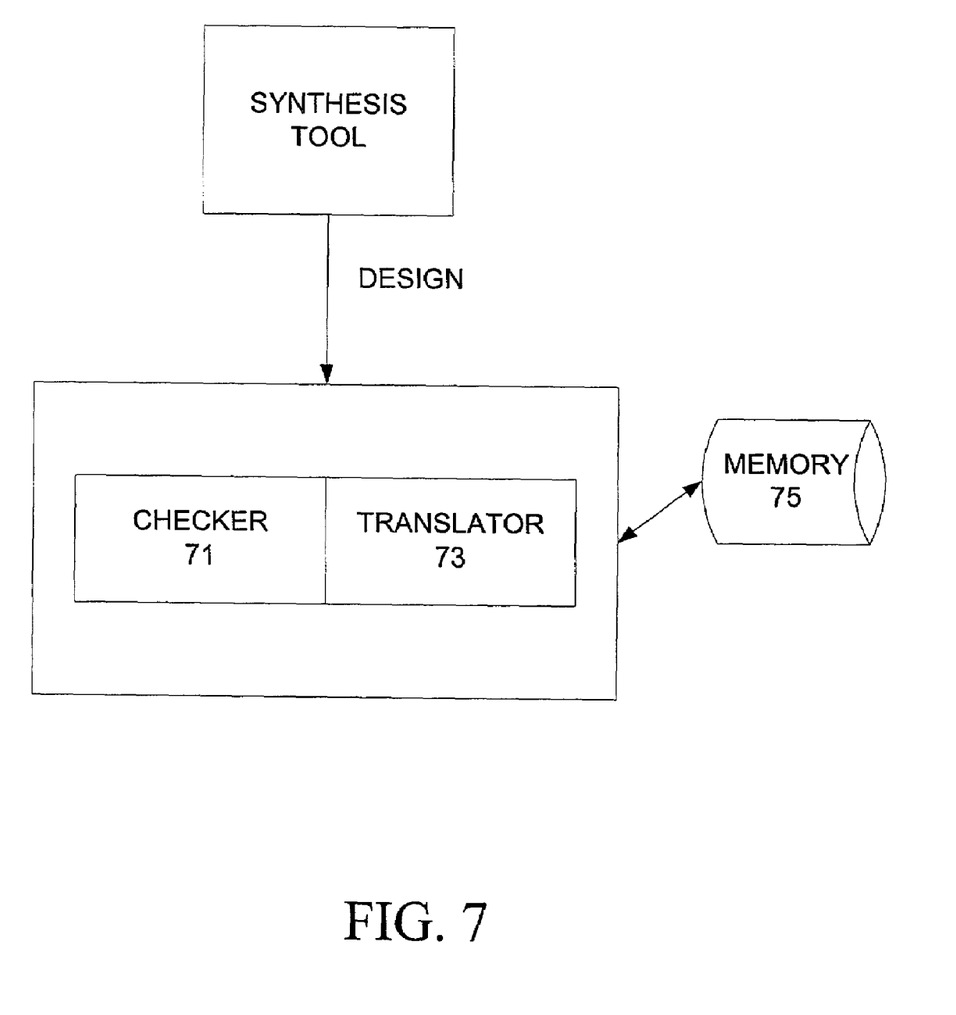
FIG. 7 illustrates a block diagram of one embodiment of the verification system of the present invention.

FIG. 7 illustrates a block diagram of one embodiment of a verification architecture or system of the present invention. The verification system includes a translator 71 and a checker 73. The translator receives a representation or description of the design. In the embodiment illustrated, the design description is provided by a synthesis tool coupled to the verification system. The translator generates a state transition system from the received design. The translator provides the state transition system to the checker. The checker retrieves assumptions and guarantees predetermined and stored in memory 75. Utilizing the assumptions, the checker symbolically simulates the state transition system. Upon completion of the simulation, the checker identifies if the guarantees are valid and if so the design is verified. If the guarantees are not valid, the checker generates counterexamples to assist in the identification of errors in the design or representation of the design. By integrating the verification architecture with the synthesis tools, design errors can be identified early in the design process.

Accordingly, the present invention provides a verification method and system for hardware and software designs.

Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive. The scope of the invention to be determined by the appended claims and their equivalence rather than the foregoing description.

What is claimed is:

1. A method of verifying correctness of a software or hardware design provided as a high-level description, the method comprising:
    extracting from a high-level description of the software or hardware design a state transition system, the state transition system comprising a plurality of states;
    establishing assumptions considered to be true for the state transition system at an initial clock cycle, wherein at least one of the assumptions is a linear arithmetic relation between two variables in the state transition system;
    establishing guarantees for the state transition system in which predetermined conditions hold after a fixed number of clock;
    retrieving the assumptions and the guarantees from a memory;
    simulating the state transition system to obtain simulation results; and
    comparing the simulation results to expected results to determine whether the software or hardware design is correct, the software or hardware design being correct if the simulation results correspond to the expected results, and storing the simulation results in the memory.

2. The method of claim 1 wherein the state transition system is simulated for a limited number of clock cycles.

3. The method of claim 1 wherein the state transition system is simulated using symbolic simulation.

4. The method of claim 3 wherein the symbolic simulation is a back-image computation by backward traversal of the state transition system.

5. The method of claim 3 wherein the symbolic simulation is a next-state computation by forward traversal of the state-transition system.

6. The method of claim 1 further comprising generating explicit counter-example traces.

7. The method of claim 1 further comprising:
    determining a control data flow graph from the high-level description; and
    extracting the state transition system from the control data flow graph.

* * * * *